June 18, 1957 G. J. FREUND 2,796,585
SINGLE SIDEBAND SCHEME
Filed Aug. 13, 1953
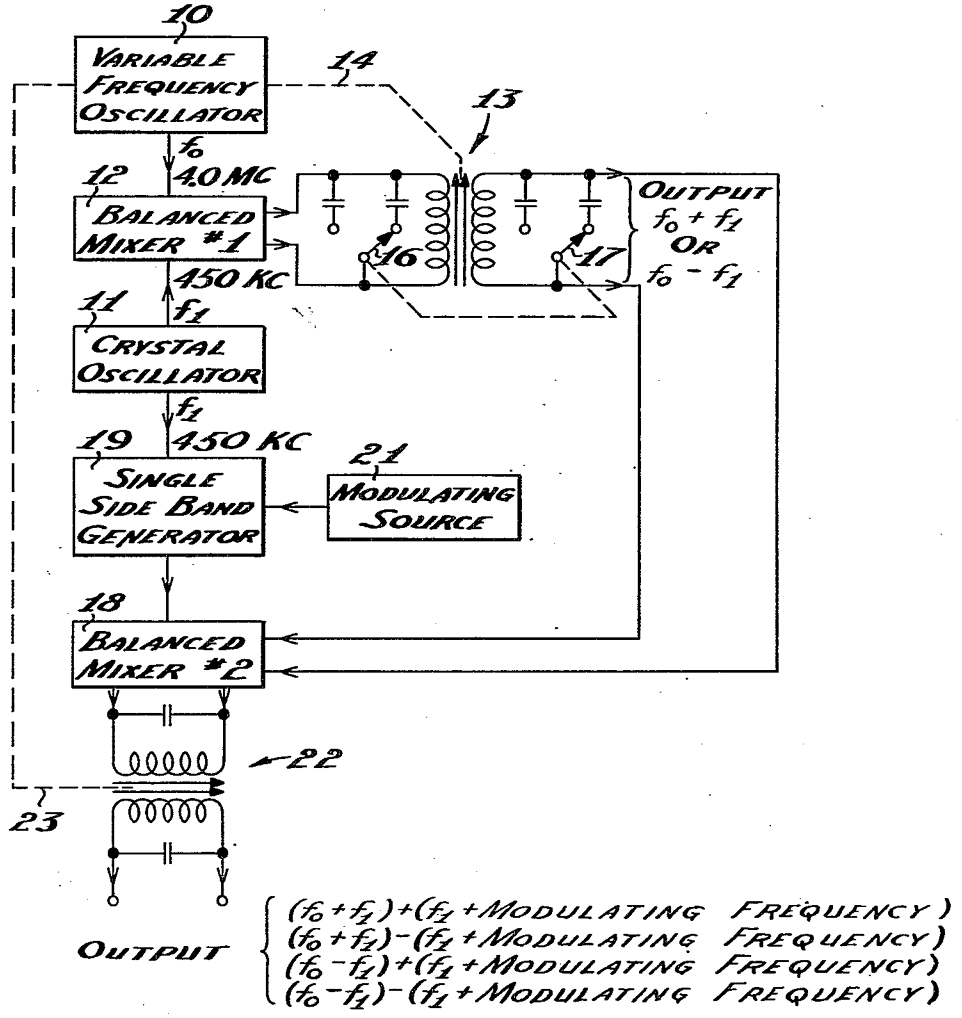
INVENTOR.
GEORGE JAMES FREUND
BY Marvin Moody
ATTORNEY United States Patent Office 2,796,585

Patented June 18, 1957

2,796,585

SINGLE SIDEBAND SCHEME

George James Freund, Dallas, Tex., assignor to Collins Radio Company, Cedar Rapids, Iowa, a corporation of Iowa Application August 13, 1953, Serial No. 374,041

1 Claim. (Cl. 332—45)

This invention relates in general to electronics and in particular to a system for producing a single side band signal wherein the carrier frequency may be varied.

For a number of reasons it is oftentimes desirable to produce a single side band signal. For example, the band width is appreciably decreased when single side band transmission is used.

It is an object of the present invention to provide a frequency scheme wherein a variable frequency oscillator may be used as the carrier for a single side band transmission.

It is another object of this invention to produce a single side band signal from a variable frequency oscillator and in which the frequency stability of the output is dependent only upon the stability of the variable frequency oscillator.

Further features, objects and advantages will become apparent from the following description and claim when read in view of the drawing, in which the figure illustrates the frequency scheme of this invention.

The figure illustrates a variable frequency oscillator 10 which might be, for example, a permeability tuned oscillator such as described in the Hunter Patent #2,468,071. A crystal oscillator 11 produces an output with a frequency $f_1$. A balanced mixer 12 receives inputs from the variable frequency oscillator 10 and the crystal oscillator 11.

A first tuned circuit 13 receives the output of the balanced mixer 12 and is ganged to the variable frequency oscillator 10 by a shaft 14 so that they tune together. The tuned circuit 13 has a pair of selector switches 16 and 17 in the input and output sides, respectively, for a purpose to be later described.

The output of the tuned circuit 13 is supplied to a second balanced mixer 18.

A single side band generator 19 receives an input from the crystal oscillator 11 and a second input from a modulating source 21. The single side band generator 19 may be any one of a number of conventional types and produces and output frequency $f_1$ plus the modulation frequency derived from the modulating source 21.

The output of the single side band generator 19 is supplied to the balanced mixer 18.

A second tuned circuit 22 receives the output of the balanced mixer 18. A shaft 23 connects the second tuned circuit 22 to the variable frequency oscillator 10 so that they tune together.

The output of the second tuned circuit 18 includes a component which is a single side band signal of the output $f_0$ of the variable frequency oscillator 10 and the modulating frequency provided by the modulating source 21.

For explanatory purposes of operation, let it be assumed that the output frequency of the variable frequency oscillator is four megacycles and that the output frequency of the crystal oscillator is 450 kilocycles.

Let it be assumed that when the switches 16 and 17 of the first tuned circuit 13 are to the right as shown in the figure, that the tuned circuit passes the sum frequencies $f_0$ plus $f_1$ or 4450 kilocycles. On the other hand, if the switches 16 and 17 are to the left, the tuned circuit will pass the difference frequency of $f_0$ minus $f_1$ or 3550 kilocycles. It is to be realized, of course, that the variable frequency oscillator varies about the frequency of four megacycles and that the tuned circuit will correspondingly vary with it due to the shaft tie-in between the two devices.

Let it be assumed that the second tuned circuit 22 is tuned to the frequency $f_0$ of the variable frequency oscillator and that the shaft 23 continuously tunes the second tuned circuit with the variable frequency oscillator.

If the sum frequency $f_0$ plus $f_1$ is selected by switches 16 and 17, then the output of the second balanced mixer 18 will be:

$$(f_0+f_1)+(f_1+\text{modulating frequency})$$
$$(f_0+f_1)-(f_1+\text{modulating frequency})$$

On the other hand, if the output of the first tuned circuit was $f_0$ minus $f_1$, then the output of the second mixer 18 would be:

$$(f_0-f_1)+(f_1+\text{modulating frequency})$$
$$(f_0-f_1)-(f_1+\text{modulating frequency})$$

If the output of the second mixer is tuned to $f_0$ and ganged with the variable frequency oscillator so as to always be tuned to $f_0$, then the output of the second tuned circuit 22 will be:

(1) When $(f_0+f_1)$ is fed into the second mixer; $(f_0+f_1)-(f_1+\text{modulating frequency})=f_0-\text{modulating frequency}$, or a single side band signal with a carrier frequency of $f_0$ and the lower side band transmitted.

(2) When $(f_0-f_1)$ is fed into the second mixer; $(f_0-f_1)+(f_1+\text{modulating frequency})=f_0+\text{modulating frequency}$ or a single side band signal with a carrier frequency of $f_0$ and the upper side band transmitted.

Therefore, we are able to produce a single side band signal with either side band transmitted by merely selecting $(f_0+f_1)$ or $(f_1-f_0)$ from the first mixer by tuned circuit 13. If single side band suppressed carrier operation is desired, then all that need be done is suppress $f_1$ in the single side band generator 19.

The advantages of my system are:

(1) Since $f_1$ and the carrier frequency for the single side band frequency are the same, only one crystal oscillator is needed. Also, since these frequencies are always identical because they come from the same source, exactly the same frequency is added and taken away from $f_0$ by the mixers and the output frequency of the system is dependent only on the stability and calibration of the variable frequency oscillator.

(2) Only one side band filter is required in the single side band generator. Also the side with sharp cut-off of the single side band filter may be utilized since it does not make any difference which side of the filter passband the carrier is placed. In other words, if the filter passband is on the high frequency side of the carrier $f_1$, then the single side band output will be $f_1$ plus the modulating frequency, but on the other hand if the filter passband is on the lower side of the carrier $f_1$, then the single side band output will be $f_1$ minus the modulating frequency. The only difference that this would make in the above example is in the selection of $f_0$ minus $f_1$ by the switches 16 and 17 for the upper side band transmission of $f_0$ plus $f_1$ by the switches 16 and 17 for the lower side band transmission.

(3) The system may be easily adaptable to normal operation from the variable frequency oscillator.

(4) The system is operable with any variable frequency output from the oscillator 10.

(5) The variable frequency oscillator output of $f_0$ may be used for carrier re-insertion in a receiver for receiving single side band suppressed carrier signal whose carrier frequency is $f_0$.

It is seen that this invention provides a new and novel manner of obtaining a single side band signal, and although it has been described with respect to a preferred embodiment thereof, it is not to be so limited as changes and modifications may be made therein which are within the full intended scope of the invention as defined by the appended claim.

I claim:

Means for modulating a variable frequency oscillator to form a single sideband signal comprising, a first mixer receiving an input from said variable frequency oscillator, a crystal oscillator supplying an input to said first mixer, said variable oscillator having a frequency which is substantially nine times the frequency of said crystal oscillator a single sideband generator receiving an input from said crystal oscillator, a modulating source supplying an input to said single sideband generator, a second mixer receiving an input from said single sideband generator, a first tuned circuit connected to the output of the first mixer and coupled to the variable frequency oscillator so that it is continually tuned to the difference frequencies of the variable and crystal oscillators, and a second tuned circuit connected to the output of the second mixer and coupled to the variable frequency oscillator so that it is continuously tuned with the variable frequency oscillator to pass the variable frequency oscillator frequency modulated by the modulated source.

References Cited in the file of this patent

FOREIGN PATENTS 901,930 France ---------------- Nov. 20, 1944